United States Patent [19]

Law et al.

[11] Patent Number: 5,589,233
[45] Date of Patent: Dec. 31, 1996

[54] SINGLE CHAMBER CVD PROCESS FOR THIN FILM TRANSISTORS

[75] Inventors: Kam Law, Union City; Robert Robertson, Palo Alto; Guofu J. Feng, San Jose, all of Calif.

[73] Assignee: Applied Materials, Inc., Santa Clara, Calif.

[21] Appl. No.: 466,915

[22] Filed: Jun. 6, 1995

Related U.S. Application Data

[63] Continuation of Ser. No. 174,103, Dec. 28, 1993, abandoned.

[51] Int. Cl.$^6$ .............................. C23C 16/00; B05D 3/06
[52] U.S. Cl. ..................... 427/579; 427/578; 427/255; 427/255.1; 427/255.7; 427/248.1; 437/101; 437/909
[58] Field of Search .................... 427/248.1, 255, 427/255.1, 255.7, 578, 579, 534; 134/1.1; 437/101, 909

[56] References Cited

U.S. PATENT DOCUMENTS

| | | | |
|---|---|---|---|
| 4,609,930 | 9/1986 | Yamazaki | 257/61 |
| 4,910,042 | 3/1990 | Hokynar | 427/534 |
| 5,114,869 | 5/1992 | Tanaka et al. | 437/101 |
| 5,221,414 | 6/1993 | Langley et al. | 427/534 |
| 5,266,504 | 11/1993 | Blouse et al. | 437/31 |
| 5,281,546 | 1/1994 | Possin et al. | 437/40 |

FOREIGN PATENT DOCUMENTS

| | | | |
|---|---|---|---|
| 0211401A2 | 2/1987 | European Pat. Off. | H01L 21/00 |
| 2590406 | 5/1987 | France | H01L 21/00 |

OTHER PUBLICATIONS

R. L. Bratter and J. E. Hitchner, "Dielectric Structure as an Out-Diffusion Barrier," *IBM Technical Disclosure Bulletin*, vol. No. 6, p. 1422, Nov. 1970.

*Primary Examiner*—Roy V. King
*Attorney, Agent, or Firm*—Fish & Richardson P.C.

[57] ABSTRACT

A method of depositing layers of intrinsic amorphous silicon and doped amorphous silicon sequentially on a substrate in the same CVD chamber without incurring a dopant contamination problem. The method can be carried out by first depositing an additional layer of a dielectric insulating material prior to the deposition process of the intrinsic amorphous silicon layer. The additional layer of insulating material deposited on the substrate should have a thickness such that residual insulating material coated on the chamber walls is sufficient to cover the residual dopants on the chamber walls left by the deposition process of the previous substrate. This provides a clean environment for the next deposition process of an intrinsic amorphous silicon layer on a substrate in the same CVD chamber.

17 Claims, 1 Drawing Sheet

SINGLE CHAMBER CVD PROCESS FOR THIN FILM TRANSISTORS

This is a continuation of application Ser. No. 08/174,103 filed on Dec. 28, 1993, now abandoned.

FIELD OF THE INVENTION

The present invention generally relates to an improved method of sequentially depositing an intrinsic amorphous silicon layer and a doped amorphous silicon layer containing at least one dopant on a substrate positioned in a chemical vapor deposition chamber. More particularly, the invention relates to an improved method of depositing an intrinsic amorphous silicon layer and a doped amorphous silicon layer containing at least one dopant on a thin film transistor substrate in the same chemical vapor deposition chamber without contaminating the intrinsic amorphous silicon layer by the dopant.

BACKGROUND OF THE INVENTION

Plasma-enhanced chemical vapor deposition (PECVD) is a process widely used in the manufacture of semiconductor devices for depositing layers of electronic materials on various substrates. In a PECVD process, a substrate is placed in a vacuum deposition chamber equipped with a pair of parallel plate electrodes. The substrate is generally mounted on a susceptor which is also the lower electrode. A flow of a reactant gas is provided in the deposition chamber through a gas inlet manifold which also serves as the upper electrode. A radio frequency (RF) voltage is applied between the two electrodes which generates an RF power sufficient to cause a plasma to be formed in the reactant gas. The plasma causes the reactant gas to decompose and deposit a layer of the desired material on the surface of the substrate body. Additional layers of other electronic materials can be deposited on the first layer by flowing into the deposition chamber a reactant gas containing the material of the additional layer to be deposited. Each reactant gas is subjected to a plasma which results in the deposition of a layer of the desired material.

In recent years, large liquid crystal cells have been used for flat panel displays. These type of liquid crystal cells contain two glass plates joined together with a layer of a liquid crystal material sandwiched therebetween. The glass substrates have conductive films coated thereon with at least one of the substrates being transparent such as an ITO film. The substrates can be connected to a source of power to change the orientation of the liquid crystal material. Various areas of the liquid crystal cell can be accessed by proper patterning of the conductive films. More recently, thin film transistors have been used to separately address areas of the liquid crystal cell at very fast rates. Such liquid crystal cells are useful for active matrix displays such as TV and computer monitors.

As the requirements for resolution of liquid crystal monitors increase, it is becoming desirable to address a large number of separate areas of the liquid crystal cell, called pixels. In a modern display panel, more than 1,000,000 pixels can be present. At least the same number of transistors must be formed on the glass plates such that each pixel can be separately addressed and left in the switched state while other pixels are addressed.

One of the two major types of thin film transistor devices used is the so-called back channel etched (BCE) thin film transistor. A major CVD process step in BCE TFT processing is the sequential deposition of three layers; an insulating layer of typically a gate silicon nitride, gate silicon oxide, or both followed by an intrinsic (un-doped) amorphous silicon (i-a-Si) layer, and then a thin layer of phosphorus-doped amorphous silicon ($n^+$-a-Si) in three separate CVD chambers. Although the doped amorphous silicon layer may be only about 40–60 nm thick, conventionally it must be deposited in a separate process chamber, so that no residual phosphorus can be left in the chamber to contaminate the intrinsic amorphous silicon film in a subsequent process.

The deposition step for the doped amorphous silicon layer is important in the total deposition process for the amorphous silicon-based TFT. The doped amorphous silicon layer deposited on top of the intrinsic amorphous silicon layer improves the electrical contact between the intrinsic amorphous silicon layer and the subsequently deposited metal layer. The deposition of a thin doped amorphous silicon layer between such intrinsic amorphous silicon layer and the metal layer allows an ohmic contact to be formed between the two layers.

If only a single one CVD chamber were to be used for the deposition of both the intrinsic amorphous silicon layer and the doped amorphous silicon layer, any residual dopant gas or particles, i.e. particles of phosphorus, antimony, arsenic or boron, become contaminants when such particles are left in the chamber and cover the chamber walls. When the deposition process is repeated for the next TFT substrate, the residual dopants left on the chamber wall contaminate the intrinsic amorphous silicon layer as an impurity. Such contamination renders the thin film transistor device defective and unusable.

As a consequence, when a conventional PECVD process is used for the manufacture of thin film transistors to sequentially deposit a layer of intrinsic amorphous silicon and doped amorphous silicon, the deposition process for the doped amorphous silicon layer must be conducted in a separate CVD chamber from the chamber used for the undoped amorphous silicon layer. Because of the large size and weight of glass substrates which are for example about 360×465×1.1 mm in size, large reaction chambers are generally required for deposition of thin films thereon, and large and often slow transfer equipment is needed to transfer the substrates from one reaction chamber to another for sequential deposition of these thin films. The transfer of substrates consumes valuable processing time and reduces the throughput of the system. Furthermore, the transfer is generally accompanied by a drop in substrate temperature; thus the substrate has to be reheated up to the deposition temperature after such transfer, again adding to the processing time required for deposition. In addition, the danger of contamination of the deposited film during transfer from one chamber to another is always present.

It is therefore an object of the present invention to provide a high-throughput method of depositing layers of intrinsic amorphous silicon and doped amorphous silicon sequentially on a substrate.

It is another object of the present invention to provide an improved method of depositing layers of intrinsic amorphous silicon and doped amorphous silicon sequentially on a substrate in the same chemical vapor deposition chamber without incurring a contamination problem in the intrinsic amorphous silicon layer.

SUMMARY OF THE INVENTION

In accordance with the present invention, layers of intrinsic amorphous silicon and doped amorphous silicon are sequentially deposited on a substrate in the same CVD chamber without incurring any contamination problems caused by the dopant is provided.

In a preferred embodiment, the layers of intrinsic amorphous silicon and doped amorphous silicon are sequentially deposited on a substrate in the same CVD chamber by first depositing a layer of a dielectric insulating material prior to the deposition process for the intrinsic amorphous silicon layer. The layer of insulating material deposited on the TFT substrate must have a minimal thickness such that there are sufficient residual insulating material coated on the chamber walls to substantially cover all the residual dopants on the chamber walls left by the deposition process of the previous substrate. This effectively provides a clean environment for the next deposition process of the intrinsic amorphous silicon layer on the substrate in the same CVD chamber. This process can then be repeated for other substrates.

An in-situ plasma cleaning process of the chamber interior can be carried out after between one to ten substrates are deposited in such chamber. The plasma cleaning process effectively removes all the insulating material and the dopant from the chamber walls. The frequency of such in-situ cleaning depends on many processing parameters which must be determined in each deposition process.

BRIEF DESCRIPTION OF THE DRAWING

Other objects, features and advantages of the present invention will become apparent upon consideration of the specification and the appended drawings, in which.

DETAILED DESCRIPTION OF THE PREFERRED EMBODIMENT

Figures 1, 2:
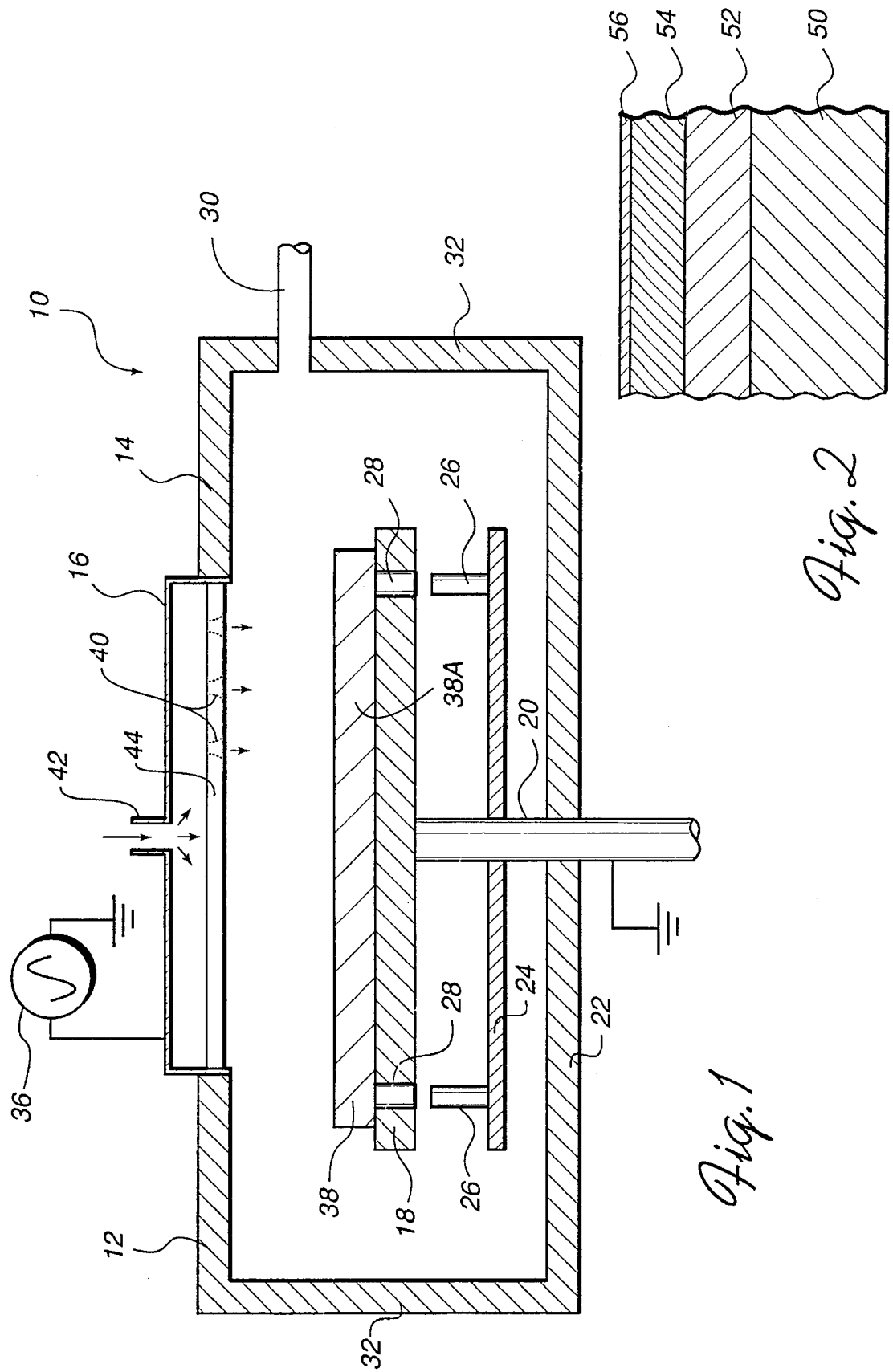
FIG. 1 is a schematic sectional view of a plasma-enhanced chemical vapor deposition chamber in which the method in accordance with the present invention can be carried out.
FIG. 2 is an enlarged sectional view of a CVD processed tri-layer structure for the back channel etched thin film transistor.

The present invention discloses an improved method of depositing layers of intrinsic amorphous silicon and doped amorphous silicon sequentially on a substrate in the same CVD chamber without incurring problems of contaminating the intrinsic amorphous silicon layer with residual dopants on the chamber walls.

Referring initially to FIG. 1, there is shown a schematic sectional view of a plasma-enhanced chemical vapor deposition apparatus 10 in which the method in accordance with the present invention can be carried out. Turner et al. disclose such an apparatus in U.S. patent application Ser. No. 08/010,683, filed Jan. 28, 1993. A deposition chamber 12 includes an opening therethrough a top wall 14 and a first electrode or a gas inlet manifold 16 within the opening. Alternatively, the top wall 14 can be solid with the electrode 16 being adjacent to the inner surface thereof. Within chamber 12 is a susceptor 18 in the form of a plate which extends parallel to the first electrode 16. The susceptor 18 is typically of aluminum and is coated with a layer of aluminum oxide. The susceptor 18 is connected to ground so that it serves as a second electrode. The susceptor 18 is mounted on the end of a shaft 20 which extends vertically through a bottom wall 22 of the deposition chamber 12. The shaft 20 is movable vertically so as to permit the movement of the susceptor 18 vertically toward and away from the first electrode 16. A lift-off plate 24 extends horizontally between the susceptor 18 and the bottom wall 22 of the deposition chamber 12 substantially parallel to the susceptor 18 and is vertically movable. Lift-off pins 26 project vertically upwardly from the lift-off plate 24. The lift-off pins 26 are positioned to be able to extend through lift holes 28 in the susceptor 18, and are of a length slightly longer than the thickness of the susceptor 18. While there are only two lift-off pins 26 shown in the figure, there may be more of the lift-off pins 26 spaced around the lift-off plate 24. A gas outlet 30 extends through a side wall 32 of the deposition chamber 12 and is connected to means (not shown) for evacuating the deposition chamber 12. A gas inlet pipe 42 extends into the first electrode or the gas inlet manifold 16 of the deposition chamber 12, and is connected through a gas switching network (not shown) to sources (not shown) of various gases. The first electrode 16 is connected to an RF power source 36. A transfer paddle (not shown) is typically provided to carry substrates through a load-lock door (not shown) into the deposition chamber 12 and onto the susceptor 18, and also to remove the coated substrate from the deposition chamber 12.

In the operation of the deposition apparatus 10, a substrate 38 is first loaded into the deposition chamber 12 and is placed on the susceptor 18 by the transfer paddle (not shown). The substrate 38 is of a size to extend over the lift holes 28 in the susceptor 18. A commonly used size for a thin film transistor substrate is approximately 360 mm by 465 mm. The susceptor 18 is positioned above the lift-off pins 26 by moving shaft 20 upwards such that the lift-off pins 26 do not extend through the holes 28, and the susceptor 18 and substrate 38 are relatively close to the first electrode 16. The electrode spacing or the distance between the substrate surface and the discharge surface of the gas inlet manifold 16 is between about 0.5 to about 2 in. A more preferred electrode spacing is between about 0.8 to about 1.4 in.

Before the deposition process of the invention, the substrate 38, which is a large TFT sheet of glass is processed according to well known TFT techniques. After which, in the preferred embodiment, a top most layer containing a patterned metal of aluminum is deposited.

At the start of the deposition process of the invention, the deposition chamber 12 is first evacuated through the gas outlet 30. Then, the patterned TFT substrate 38 is positioned on the susceptor 18.

Different types of thin film transistors are in current use. Most of these transistors require deposition of a gate dielectric layer over a patterned gate metal on a TFT substrate with an amorphous silicon layer coated on top of the gate dielectric layer. Metal is deposited thereafter over the amorphous silicon film, which also can have a thin layer of doped amorphous silicon thereover to improve contact between the amorphous silicon and the overlying metal. A detailed description of such a process is contained in a co-pending application Docket No. 406 by Law et al. assigned to the common assignee which is hereby incorporated by reference in its entirety.

Gate dielectric layers of silicon nitride must be of high quality to be useful as the insulating layer in forming thin film transistors on glass substrates. In the present invention, high quality silicon nitride films are achieved by maintaining the pressure in the CVD chamber at between about 1.2 to about 1.5 Torr, the substrate temperature at about 300° to 350° C. during deposition. Reactant gas flow rates are regulated to maintain adequate reactant gas levels. Suitably, for substrate areas quoted above, silane at between 100 and 300 sccm and ammonia at between 500 and 1,000 sccm are employed in a carrier gas of nitrogen at between 1,000 and 10,000 sccm to deposit silicon nitride films. A suitable thickness of the gate silicon nitride film (or the gate insulator layer) is between about 50 and 1,000 nm.

Other gate dielectric materials such as silicon oxide, silicon oxy-nitride, and polymeric based dielectric materials such as PMDA-ODA, Teflon, polyquinoline, polyimide and siloxanes can also be suitably used in the present invention process as the dielectric insulating layer.

FIG. 2 shows an enlarged cross-sectional view of a tri-layer CVD processed back channel etched thin film transistor. A TFT substrate 50 of glass coated with patterned metal (not shown) such as aluminum is first deposited with a layer of passivating gate dielectric insulator material 52 such as passivating silicon nitride, gate silicon oxide or multiple layers of gate silicon oxide and gate silicon nitride. An intrinsic or un-doped amorphous silicon layer 54 is then deposited on the gate insulator layer to a thickness between about 200 and about 400 nm. In the next deposition process, a layer of approximately 40 to 60 nm thickness of doped amorphous silicon layer 56 is deposited on the intrinsic amorphous silicon layer 54. The dopant used is phosphorus. However, other dopant elements such as antimony, arsenic and boron can work in the present invention.

A typical deposition process and its processing conditions are shown in the following example:

| Gate Silicon Nitride Deposition | |
|---|---|
| $SiH_4$ | 110 sccm |
| $NH_3$ | 550 sccm |
| Nitrogen | 3900 sccm |
| RF Power | 600 watts |
| Pressure | 1.2 torr |
| Electrode Spacing | 1000 mils |
| Susceptor Temp. | 397° C. |
| Substrate Temp. | 340° C. |
| Intrinsic Amorphous Silicon Deposition | |
| $SiH_4$ | 275 sccm |
| $H_2$ | 1550 sccm |
| RF Power | 300 watts |
| Pressure | 1.2 torr |
| Electrode Spacing | 1000 mils |
| Susceptor Temp. | 397° C. |
| Substrate Temp. | 320° C. |
| Doped Amorphous Silicon Deposition | |
| $SiH_4$ | 275 sccm |
| $H_2$ | 1000 sccm |
| 0.5% $PH_3$ in $H_2$ | 500 sccm |
| RF Power | 300 watts |
| Pressure | 1.2 torr |
| Electrode Spacing | 1000 mils |
| Susceptor Temp. | 397° C. |
| Substrate Temp. | 320° C. |

The present invention allows the deposition of all three layers of gate silicon nitride, intrinsic amorphous silicon and doped amorphous silicon in a single CVD process chamber. It is most beneficially carried out in a compact CVD chamber system which allows rapid change and stabilization of gases in the chamber and, a much smaller area of process chamber walls which allows the doped amorphous silicon deposited on the walls to be covered effectively during the insulator deposition process. As a consequence, the residual dopant remains buried by silicon nitride during the subsequent intrinsic amorphous silicon deposition process resulting in virtually no contamination of the intrinsic amorphous silicon layer. The capability of in-situ plasma cleaning of the process chamber allows frequent chamber cleaning such that total accumulation of deposits on the walls remains low. This eliminates residual contamination due to film peeling from the walls which results from thick accumulation.

The present invention one-chamber system also offers another benefit of system reliability. In a conventional system, only one chamber is used for the doped amorphous silicon deposition, while more than one chambers are used for deposition of other layers. If the doped amorphous silicon chamber is down for any reason such as for maintenance, the entire deposition system is down. When the present invention one-chamber system is used, each chamber works independently and thus offers much greater system reliability.

A series of tests were conducted to determine the effectiveness of the single chamber CVD process. The conductivity of the intrinsic amorphous silicon layer is a good measure of dopant contamination. The conductivity of a typical doped amorphous silicon is in the order of $10^{-2}$ $(Ohm-cm)^{-1}$, while that of the intrinsic amorphous silicon layer is in the order of $10^{-10}$ $(Ohm-cm)^{-1}$.

EXAMPLE

Test results shown for Sample No. 1 in Table 1 were obtained on samples deposited in a phosphorus-free chamber for use as a reference of the phosphorus-free film. The other samples were deposited in a chamber in which doped amorphous silicon films are frequently processed. These samples were prepared by the following processing steps:

1) in-situ plasma cleaning of the chamber, 2) deposition of 50 nm doped amorphous silicon, 3) deposition of gate silicon nitride of the given thickness on a substrate, in Sample No. 2, no such layer was grown, 4) deposition of 100 nm intrinsic amorphous silicon on a new substrate introduced into the same chamber, and 5) measurement of the conductivity of the intrinsic amorphous silicon film.

TABLE 1

| Sample Number | Thickness of g-SiNx (nm) | Conductivity of i-a-Si $(Ohm-cm)^{-1}$ |
|---|---|---|
| 1 | Phosphorus-free chamber | $1.4 \pm 1.0 \times 10^{-10}$ |
| 2 | 0 | $9.2 \pm 0.5 \times 10^{-8}$ |
| 3 | 200 | $6.0 \pm 1.0 \times 10^{-10}$ |
| 4 | 400 | $1.7 \pm 1.0 \times 10^{-10}$ |

It is seen from Table 1 that the effectiveness of the gate silicon nitride layer as a barrier layer takes place within the thickness range between 200 nm (Sample 2) and 400 nm (Sample 3). It has been discovered that a sufficient or minimum thickness for the gate silicon nitride layer to function as a barrier layer is approximately 200 nm. At thickness of 200 nm and greater, the effect is even greater.

When a thickness of less than 200 nm is used for the gate silicon nitride layer, a seasoning process for the CVD chamber may be first carried out. In such a process, a plasma is ignited in the reactant gas for an insulating material, which may be silicon nitride or some other dielectric material, between the electrodes without a substrate in the chamber to substantially cover the chamber walls with the insulating material. A substrate is then loaded into the chamber and the tri-layer amorphous silicon deposition process is carried out.

While the present invention has been described in an illustrative manner, it should be understood that the terminology used is intended to be in a nature of words of description rather than of limitation.

Furthermore, while the present invention has been described in terms of a preferred embodiment thereof, it is to be appreciated that those skilled in the art will readily apply these teachings to other possible variations of the invention. For instance, other dielectric insulating materials may be used in place of gate silicon nitride and other dopants may be used in place of phosphorus.

The embodiments of the invention in which an exclusive property or privilege is claimed are defined as follows:

1. A method of sequentially depositing an intrinsic silicon layer and a doped silicon layer containing a dopant on a substrate positioned in a chemical vapor deposition chamber having interior chamber surfaces without substantially contaminating the intrinsic silicon layer by said dopant, said method comprising the steps of:

depositing simultaneously on said substrate and said interior chamber surfaces a layer of at least one insulating material of a thickness sufficient to cover up any residual dopant particles left on said interior chamber surfaces from a previous deposition cycle, depositing a layer of intrinsic silicon having a first thickness on top of said at least one insulating material on said substrate, and depositing a layer of doped silicon having a second thickness on top of said intrinsic silicon on said substrate, wherein all three depositing steps which comprise a deposition cycle are performed in a single chemical vapor deposition chamber without an in-situ cleaning step between each deposition cycle.

2. A method according to claim 1, wherein said sufficient thickness of said insulating material is at least 200 nm.

3. A method according to claim 1, wherein said at least one insulating material is selected from the group consisting of silicon nitride, silicon oxide, silicon oxy-nitride and polymeric based dielectric materials.

4. A method according to claim 1, wherein said at least one insulating material is silicon nitride.

5. A method according to claim 1, wherein said first thickness and said second thickness are each more than 10 nm.

6. A method according to claim 1, wherein said dopant is selected from the group consisting of phosphorus, antimony, arsenic, and boron.

7. A method according to claim 1, wherein said intrinsic silicon layer and said doped silicon layer are both made of amorphous silicon.

8. A method of sequentially depositing an insulator layer, an intrinsic amorphous silicon layer and a doped amorphous silicon layer containing at least one dopant on a thin film transistor substrate in a single chemical vapor deposition chamber, said method comprising the steps of:

positioning a thin film transistor substrate in a chemical vapor deposition chamber, said chamber having chamber surfaces not covered by said substrate, depositing in a first deposition step on said substrate an insulator layer of at least one insulating material to a thickness of at least 200 nm, depositing in a second deposition step a layer of intrinsic amorphous silicon to a second thickness on said insulator layer, and depositing in a third deposition step a layer of doped amorphous silicon containing at least one dopant to a third thickness on said layer of intrinsic amorphous silicon, whereby said at least one insulating material deposited in said first deposition step for said insulator layer substantially covers any residual dopant left on said chamber surfaces during previous deposition processes to prevent said residual dopant from contaminating said subsequently deposited Intrinsic amorphous silicon layer.

9. A method according to claim 8, wherein said at least one insulating material for said insulator layer is selected from the group consisting of silicon nitride, silicon oxide, silicon oxy-nitride and polymeric based dielectric materials.

10. A method according to claim 8, wherein said method further comprising the step of in-situ plasma cleaning said chamber surfaces after the deposition process of at least two substrate.

11. A method according to claim 8, wherein said at least one dopant is selected from the group consisting of phosphorous, antimony, arsenic and boron.

12. A method of sequentially depositing an intrinsic silicon layer and a doped silicon layer containing a dopant on a substrate positioned in a chemical vapor deposition chamber having interior chamber surfaces without substantially contaminating the intrinsic silicon layer by said dopant, said method comprising the steps of:

igniting a plasma of a precursor gas of a first insulating material in said chamber to substantially cover said interior chamber surfaces with a deposition of a layer of said first insulating material without first loading a substrate into said chamber, loading a substrate into said chamber, depositing simultaneously on said substrate and on said interior chamber surfaces a layer of a second insulating material of a thickness sufficient to cover up any residual dopant particles left on said interior chamber surfaces from a previous deposition cycle, depositing a layer of intrinsic silicon having a first thickness on said layer of second insulating material, and depositing a layer of doped silicon having a second thickness on said layer of intrinsic silicon.

13. A method according to claim 12, wherein said first and second insulating material is selected from the group consisting of silicon nitride, silicon oxide, silicon oxy-nitride and polymeric-based dielectric materials.

14. A method according to claim 12, wherein said dopant is selected from the group consisting of phosphorous, antimony, arsenic and boron.

15. A method of sequentially depositing an intrinsic silicon layer and a doped silicon layer containing a dopant on a substrate positioned in a chemical vapor deposition chamber having interior chamber surfaces without substantially contaminating the intrinsic silicon layer by said dopant, said method comprising the steps of:

in-situ cleaning said interior chamber surfaces when said surfaces have not been cleaned for at least two previous deposition cycles, depositing simultaneously on said substrate and said interior chamber surfaces a layer of at least one insulating material of a thickness sufficient to cover up any residual dopant particles left on said interior chamber surfaces from a previous deposition cycle, depositing a layer of intrinsic silicon having a first thickness on top of said at least one insulating material on said substrate, and depositing a layer of doped silicon having a second thickness on top of said intrinsic silicon on said substrate.

16. A method according to claim 12, wherein said intrinsic silicon layer and said doped silicon layer are both made of amorphous silicon.

17. A method of sequentially depositing an intrinsic silicon layer and a doped silicon layer containing a dopant on a substrate positioned in a chemical vapor deposition chamber having interior chamber surfaces without substantially contaminating the intrinsic silicon layer by said dopant, said method comprising the steps of:

depositing on said substrate and said interior chamber surfaces while said substrate is positioned within said chamber a layer of at least one insulating material of a thickness sufficient to cover up any residual dopant particles left on said interior chamber surfaces from a previous deposition cycle, depositing a layer of intrinsic silicon having a first thickness on top of said at least one insulating material on said substrate, and depositing a layer of doped silicon having a second thickness on top of said intrinsic silicon on said substrate, wherein all three depositing steps which comprise a deposition cycle are performed in a single chemical vapor deposition chamber without an in-situ cleaning step between each deposition cycle.

* * * * *